(12) United States Patent
McFarland et al.

(10) Patent No.: US 11,399,149 B2
(45) Date of Patent: Jul. 26, 2022

(54) FLEXIBLE LATENCY-MINIMIZED DELIVERY AND MANAGEMENT OF DISPARATE-RATE DATA STREAMS AND SUB-STREAMS FOR PROCESSING

(71) Applicant: Cirrus Logic International Semiconductor Ltd., Edinburgh (GB)

(72) Inventors: James P. McFarland, Austin, TX (US); Nariankadu D. Hemkumar, Austin, TX (US); Sachin Deo, Austin, TX (US); Younes Djadi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 114 days.

(21) Appl. No.: 16/522,580

(22) Filed: Jul. 25, 2019

(65) Prior Publication Data

US 2021/0029319 A1 Jan. 28, 2021

(51) Int. Cl.
| | |
|---|---|
| *H04N 5/378* | (2011.01) |
| *H04N 19/132* | (2014.01) |
| *H04N 19/146* | (2014.01) |
| *H04N 19/184* | (2014.01) |
| *H04N 5/374* | (2011.01) |
| *H04N 5/3745* | (2011.01) |

(52) U.S. Cl.
CPC ........... *H04N 5/378* (2013.01); *H04N 5/3741* (2013.01); *H04N 5/37455* (2013.01); *H04N 19/132* (2014.11); *H04N 19/146* (2014.11); *H04N 19/184* (2014.11)

(58) Field of Classification Search
CPC ...................................................... H04N 5/378
USPC .......................................................... 348/399
See application file for complete search history.

(56) References Cited

U.S. PATENT DOCUMENTS

| 8,084,969 | B2* | 12/2011 | David | G01D 5/145 |
| | | | | 318/135 |
| 8,762,614 | B2 | 6/2014 | Kris | |
| 2017/0192408 | A1* | 7/2017 | Nazarathy | G05B 13/04 |
| 2019/0089389 | A1* | 3/2019 | Gutman | H03F 1/3247 |

OTHER PUBLICATIONS

International Search Report and Written Opinion of the International Searching Authority, International Application No. PCT/US2020/043024, dated Oct. 20, 2020.

(Continued)

*Primary Examiner* — Yulin Sun
(74) *Attorney, Agent, or Firm* — Jackson Walker L.L.P.

(57) ABSTRACT

A system may include a processing engine and an analog-to-digital conversion interface subsystem communicatively coupled to the processing engine. The processing engine may be configured to process feedback data converted from analog feedback data to digital feedback data, wherein the feedback data includes a plurality of data stream sequences converted from the analog feedback data to the digital feedback data at a sample rate and based on processing of the feedback data, generate digital control signals for controlling a system under control. The analog-to-digital conversion interface subsystem may be configured to flexibly control the processing of the processing engine and the generation of digital control signals by the processing engine to minimize latency in the generation of the digital control signals due to processing of the processing engine.

18 Claims, 3 Drawing Sheets

(56) References Cited

OTHER PUBLICATIONS

Mooney, James et al., "Interrupt controller for DSP-based control of multi-rail DC-DC converter with non-integer switching frequency ratio", Electronics, Circuits, and Systems (ICECS), 2010, 17th IEEE International Conference on, IEEE, Dec. 12, 2010, pp. 1204-1207.

Abdallah, Mohammed et al., "Simultaneous Multi-channel Data Acquisition and Storing System", Computing, Engineering and Information, 2009, ICCC '09 International Conference on, IEEE, Apr. 2, 2009, pp. 233-236.

* cited by examiner

FLEXIBLE LATENCY-MINIMIZED DELIVERY AND MANAGEMENT OF DISPARATE-RATE DATA STREAMS AND SUB-STREAMS FOR PROCESSING

FIELD OF DISCLOSURE

The present disclosure relates in general to electronic devices, and more particularly, to a flexible approach to latency-minimized delivery and management of disparate-rate data streams and sub-streams for subsequent processing.

BACKGROUND

Many traditional mobile devices (e.g., mobile phones) include one or more cameras for capturing images. To provide for image stabilization and focus, a position of a camera within a plane substantially parallel to a subject of an image as well as a position of a lens of the camera in a direction perpendicular to such plane, may be controlled by a plurality of motors under the control of a camera controller. A control system may be implemented using an applications processor of the mobile device coupled via a communication interface (e.g., an Inter-Integrated Circuit or I2C interface) to a camera controller local to the camera and its various motors. For example, the applications processor may communicate to the camera controller a vector of data regarding a target position for the camera, whereas the camera controller may communicate to the applications processor a vector regarding an actual position of the camera, as sensed by a plurality of magnetic sensors (e.g., Hall sensors) and/or other appropriate sensors.

A camera controller may receive a number of disparate-rate data streams and sub-streams, which it must manage and deliver to other processing components for processing of data in order to control components (e.g., motors) of the camera. Other control systems, including those used in devices other than for cameras, may also receive a number of disparate-rate data streams and sub-streams, which must also be managed and delivered to other processing components for processing of data in order to provide control of one or more components. Effective and flexible systems and methods for facilitating delivery and management of data streams are desired.

SUMMARY

In accordance with the teachings of the present disclosure, the disadvantages and problems associated with delivery and management of disparate data streams may be reduced or eliminated.

In accordance with embodiments of the present disclosure, a system may include a processing engine and an analog-to-digital conversion interface subsystem communicatively coupled to the processing engine. The processing engine may be configured to process feedback data converted from analog feedback data to digital feedback data, wherein the feedback data includes a plurality of data stream sequences converted from the analog feedback data to the digital feedback data at a sample rate and based on processing of the feedback data, generate digital control signals for controlling a system under control. The analog-to-digital conversion interface subsystem may be configured to flexibly control the processing of the processing engine and the generation of digital control signals by the processing engine to minimize latency in the generation of the digital control signals due to processing of the processing engine.

In accordance with these and other embodiments of the present disclosure, a method may include processing feedback data converted from analog feedback data to digital feedback data, wherein the feedback data includes a plurality of data stream sequences converted from the analog feedback data to the digital feedback data at a sample rate, based on processing of the feedback data, generating digital control signals for controlling a system under control, and flexibly controlling the processing of the processing engine and the generation of digital control signals by the processing engine to minimize latency in the generation of the digital control signals due to processing of the processing engine.

In accordance with these and other embodiments of the present disclosure, a computer program product may include a computer usable medium having computer readable code physically embodied therein. The computer program product may further comprise computer readable program code for processing feedback data converted from analog feedback data to digital feedback data, wherein the feedback data includes a plurality of data stream sequences converted from the analog feedback data to the digital feedback data at a sample rate, based on processing of the feedback data, generating digital control signals for flexibly controlling a system under control, and controlling the processing of the processing engine and the generation of digital control signals by the processing engine to minimize latency in the generation of the digital control signals due to processing of the processing engine.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
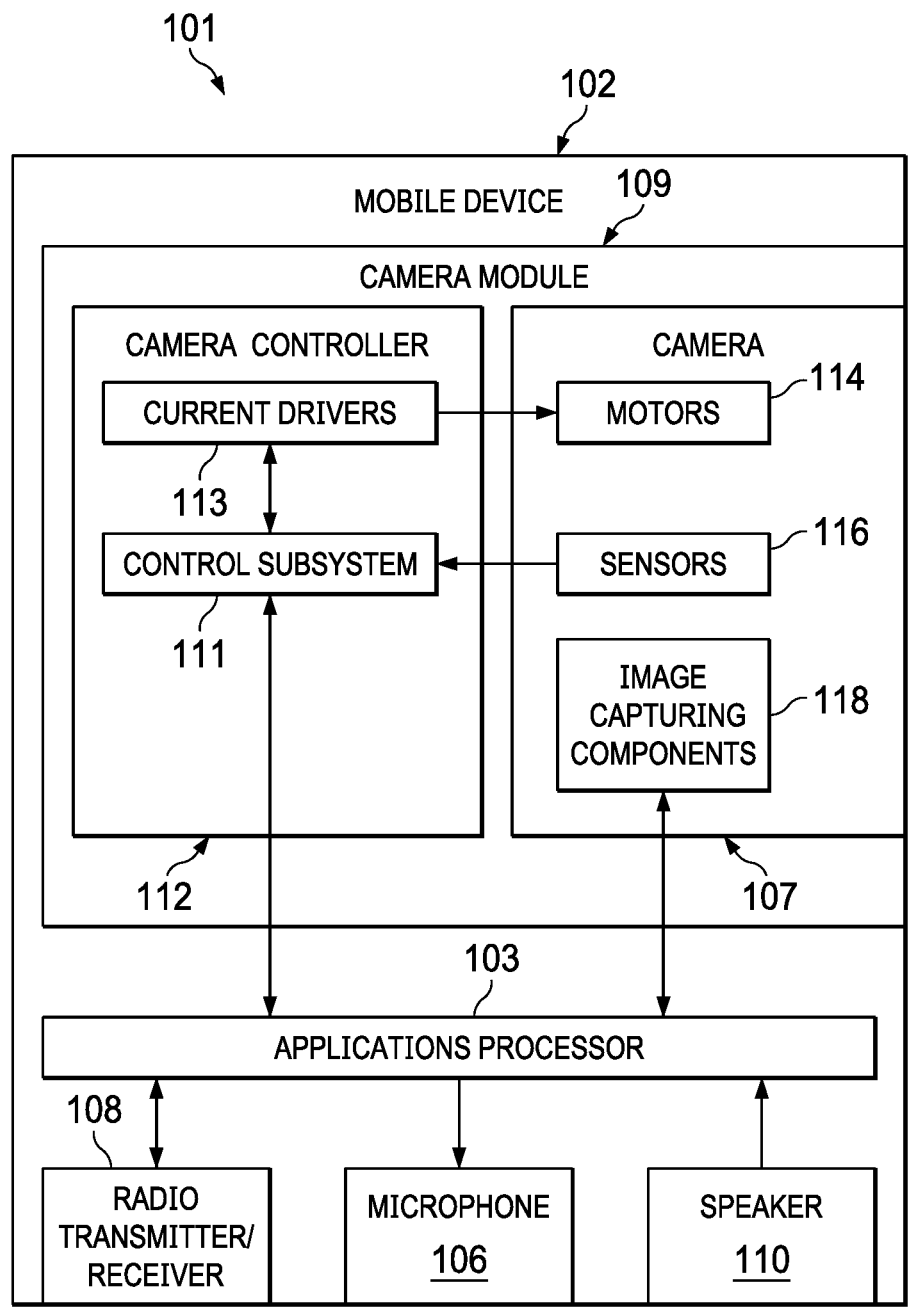
FIG. 1 illustrates a block diagram of selected components of an example mobile device, in accordance with embodiments of the present disclosure.

FIG. 1 illustrates a block diagram of selected components of an example mobile device 101, in accordance with embodiments of the present disclosure. As shown in FIG. 1, mobile device 101 may comprise an enclosure 102, an applications processor 103, a microphone 106, a radio transmitter/receiver 108, a speaker 110, and a camera module 109 comprising a camera 107 and a camera controller 112.

Enclosure 102 may comprise any suitable housing, casing, or other enclosure for housing the various components of mobile device 101. Enclosure 102 may be constructed from plastic, metal, and/or any other suitable materials. In addition, enclosure 102 may be adapted (e.g., sized and shaped) such that mobile device 101 is readily transported on a person of a user of mobile device 101. Accordingly, mobile device 101 may include but is not limited to a smart phone, a tablet computing device, a handheld computing device, a personal digital assistant, a notebook computer, a video game controller, or any other device that may be readily transported on a person of a user of mobile device 101.

Applications processor 103 may be housed within enclosure 102 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, applications processor 103 may interpret and/or execute program instructions and/or process data stored in a memory (not explicitly shown) and/or other computer-readable media accessible to applications processor 103.

Microphone 106 may be housed at least partially within enclosure 102, may be communicatively coupled to applications processor 103, and may comprise any system, device, or apparatus configured to convert sound incident at microphone 106 to an electrical signal that may be processed by applications processor 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 102, may be communicatively coupled to applications processor 103, and may include any system, device, or apparatus configured to, with the aid of an antenna, generate and transmit radio-frequency signals as well as receive radio-frequency signals and convert the information carried by such received signals into a form usable by applications processor 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

Speaker 110 may be housed at least partially within enclosure 102 or may be external to enclosure 102, may be communicatively coupled to applications processor 103, and may comprise any system, device, or apparatus configured to produce sound in response to electrical audio signal input. In some embodiments, speaker 110 may comprise a dynamic loudspeaker, which employs a lightweight diaphragm mechanically coupled to a rigid frame via a flexible suspension that constrains a voice coil to move axially through a magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Camera 107 may be housed at least partially within enclosure 102 (and partially outside of enclosure 102, to enable light to enter a lens of camera 107), and may include any suitable system, device, or apparatus for recording images (moving or still) into one or more electrical signals that may be processed by applications processor 103. As shown in FIG. 1, camera 107 may include a plurality of motors 114, sensors 116, and image capturing components 118.

Image capturing components 118 may include a collection of components configured to capture an image, including without limitation one or more lenses and image sensors for sensing intensities and wavelengths of received light. Such image capturing components 118 may be coupled to applications processor 103 such that camera 107 may communicate captured images to applications processor 103.

Motors 114 may be mechanically coupled to one or more of image capturing components 118 and each motor 114 may include any suitable system, device, or apparatus configured to, based on current signals received from camera controller 112 indicative of a desired camera position, cause mechanical motion of such one or more image capturing components 118 to a desired camera position.

Sensors 116 may be mechanically coupled to one or more of image capturing components 118 and/or motors 114 and may be configured to sense a position associated with camera 107. For example, a first sensor 116 may sense a first position (e.g., x-position) of camera 107 with respect to a first linear direction, a second sensor 116 may sense a second position (e.g., y-position) of camera 107 with respect to a second linear direction normal to the first linear direction, and a third sensor 116 may sense a third position (e.g., z-position) of camera 107 (e.g., position of lens) with respect to a third linear direction normal to the first linear direction and the second linear direction.

Camera controller 112 may be housed within enclosure 102, may be communicatively coupled to camera 107 and applications processor 103 (e.g., via an Inter-Integrated Circuit (I2C) interface), and may include any system, device, or apparatus configured to control motors 114 or other components of camera 107 to place components of camera 107 into a desired position. Camera controller 112 may also be configured to receive signals from sensors 116 regarding an actual position of camera 107 and/or regarding a status of camera 107. As shown in FIG. 1, camera controller 112 may include a control subsystem 111 and current drivers 113.

Control subsystem 111 may be integral to camera controller 112, and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, control subsystem 111 may interpret and/or execute program instructions and/or process data stored in a memory and/or other computer-readable media accessible to control subsystem 111. Specifically, control subsystem 111 may be configured to perform functionality of camera controller 112, including but not limited to control of motors 114 and receipt and processing of data from sensors 116.

Current drivers 113 may comprise a plurality of circuits, each such circuit configured to receive one or more control signals from control subsystem 111 (including without limitation a signal indicative of a desired target current for a motor 114) and drive a current-mode signal to a respective motor 114 in accordance with the one or more control signals in order to control operation of such respective motor 114.

Figure 2:
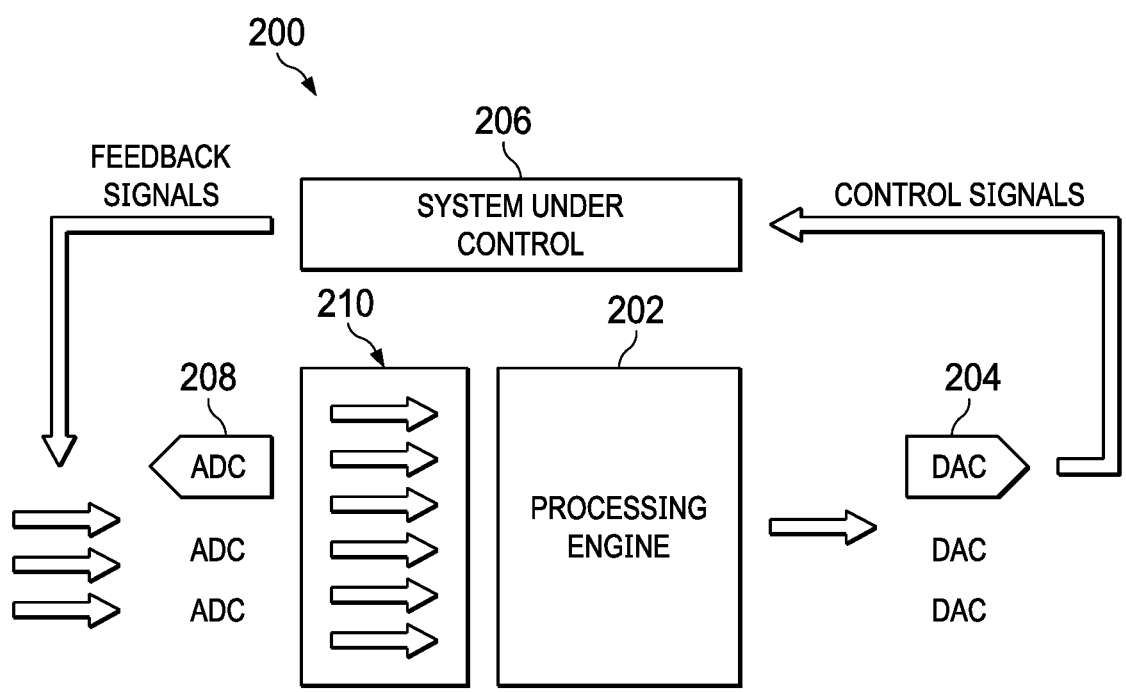
FIG. 2 illustrates a block diagram of selected components of a closed-loop feedback control subsystem, in accordance with embodiments of the present disclosure.

As may be recognized by those of skill in the art, taken together control subsystem 111, current drivers 113, motors 114, and sensors 116 may form a closed-loop feedback control system. FIG. 2 illustrates a block diagram of selected components of a closed-loop feedback control subsystem 200, in accordance with embodiments of the present disclosure. As shown in FIG. 2, closed-loop feedback control subsystem 200 may include a processing engine 202, a digital-to-analog converter (DAC) subsystem 204, a system under control 206, an analog-to-digital converter (ADC) subsystem 208, and an ADC interface subsystem 210. In camera module 109, processing engine 202 may be implemented by control subsystem 111, system under control 206 may be implemented by motors 114, DAC subsystem 204 may be implemented by current drivers 113, and feedback signals shown in FIG. 2 may be provided by sensors 116.

Processing engine 202 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processing engine 202 may interpret and/or execute program instructions and/or process data stored in a memory and/or other computer-readable media accessible to processing engine. Specifically, processing engine 202 may be configured to perform control of system under control 206, including the generation of control signals for system under control 206 and receipt of feedback signals from sensors associated with system under control 206.

DAC subsystem 204 may comprise any suitable system, device, or apparatus configured to receive digital control signals from processing engine 202 and convert such digital control signals into equivalent analog control signals for controlling operation of system under control 206.

System under control 206 may comprise any suitable system, device, or apparatus configured to operate in accordance with one or more control signals received from processing engine 202. As shown in FIG. 2, system under control 206 may generate signals (which may be generated by sensors integral to system under control 206), wherein such one or more feedback signals are indicative of a physical quantity (e.g., a position, velocity, temperature, etc.) associated with system under control 206.

ADC subsystem 208 may comprise any suitable system, device, or apparatus configured to receive analog feedback signals and convert such analog feedback signals into equivalent digital feedback signals for processing by processing engine 202. In some embodiments, ADC subsystem 208 may be implemented using a time-division-multiplexed ADC, wherein each sampling sequence of ADC subsystem 208 may be divided into a plurality of sub-sequences or "slots" wherein each sensor of system under control 206 may be assigned to one or more of such slots. In some embodiments, a slot may be further time-division multiplexed into a plurality of sub-slots. Accordingly, ADC subsystem 208 may generate multiple streams of feedback (e.g., sensor) data at various data rates.

ADC interface subsystem 210 may comprise any suitable system, device, or apparatus configured to receive the digital feedback signals generated by ADC subsystem 208, which may be received in the form of multiple streams of feedback (e.g., sensor) data at various data rates. ADC interface subsystem 210 may further manage such multiple streams of data to provide for flexibility and minimized latency for processing by processing engine 202 to generate outputs (e.g., control signals) that affect system under control 206, as described in greater detail below.

Figure 3:
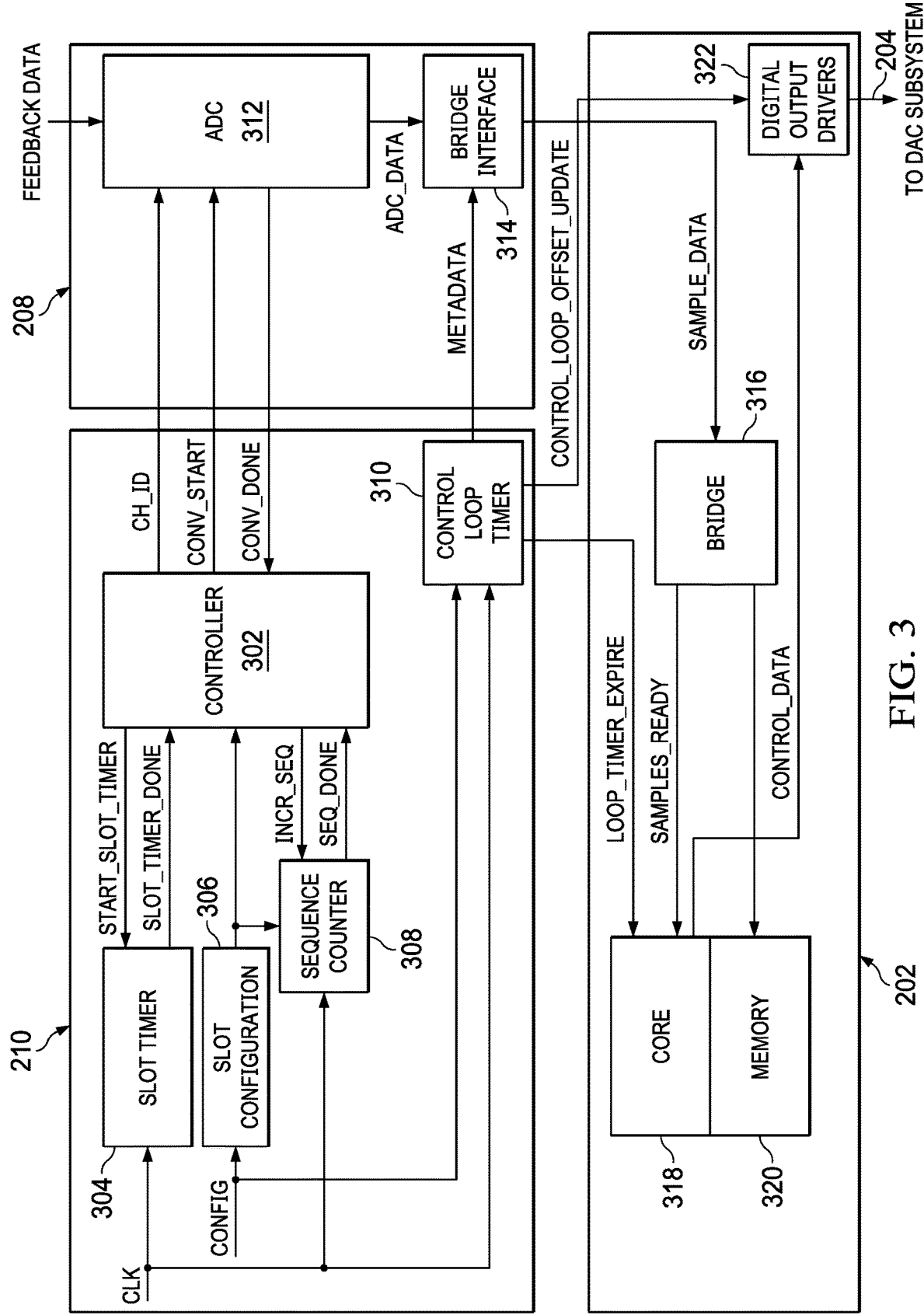
FIG. 3 illustrates a block diagram of selected components of a processing engine, analog-to-digital converter subsystem, and analog-to-digital converter interface subsystem, in accordance with embodiments of the present disclosure.

FIG. 3 illustrates a block diagram of selected components of processing engine 202, ADC subsystem 208, and ADC interface subsystem 210, in accordance with embodiments of the present disclosure. As shown in FIG. 3, ADC interface subsystem 210 may include a highly-programmable controller 302 configured to carry out overall management of ADC interface subsystem 210. Such programmability of controller 302 that may include, for example, shadow registers integral to or otherwise accessible to controller 302 may be used to allow for data configurations to be updated continuously without affecting then-current processing of data.

As depicted in FIG. 3, controller 302 may communicate a control signal START_SLOT_TIMER to a slot timer 304 for indicating the start of a slot (i.e., sub-cycle) of feedback data. Slot timer 304 may be configured to communicate a signal SLOT_TIMER_DONE indicating to controller 302 that a duration of a slot has expired. Accordingly, conversion time of a single sample may be programmable via slot timer 304.

Also as shown in FIG. 3, ADC interface subsystem 302 may include a slot configuration block 306 configured to receive configuration settings CONFIG and from the configuration settings CONFIG, determine a number of slots per sequence of ADC subsystem 208 and communicate one or more signals indicative of such number of slots per sequence to controller 302 and a sequence counter 308. Accordingly, slot configuration block 306 may serve to configure a number of data streams to be processed by processing engine 202. Further control of each data stream may include configuration settings for selectively enabling and disabling data conversion (e.g., conversion from analog to digital domain), selectively enabling and disabling data processing (e.g., processing by processing engine 202), and/or controlling a sampling rate of each data stream.

Configuration settings for slot configuration block 306 may also be set to mitigate effects of data noise. For example, in some instances the interaction between analog to digital conversions of data streams may cause the presence of data noise which may lead to inaccuracies. Accordingly, configuration settings for slot configuration block 306 may be modified in order to modify an order of data streams within a data sequence.

Based on a periodic clock signal CLK, the number of slots, and a signal INCR_SEQ, sequence counter 308 may control data rates of each data stream, such that the rates of each data stream are configurable. Accordingly, controller 302 may communicate control signal INCR_SEQ to sequence counter 308, wherein such control signal INCR_SEQ may be asserted (e.g., pulse high) each time control signal SLOT_TIMER_DONE pulses, in order to increase sequence counter 308. Sequence counter 308 may in turn be configured to communicate a signal SEQ_DONE indicating to controller 302 that a duration of a sequence has expired.

In some embodiments, various rates may further be configured with programmable sub-slots within each slot. In addition or alternatively, data rates may be controlled after setting a number of slots by either not assigning a data stream to a slot or assigning a data stream to more than one slot.

Based on the control signals received by controller 302 from slot timer 304, slot configuration block 306, and sequence counter 308, controller 302 may generate various control signals for controlling a time-division multiplexed ADC 312. Such control signals may include a channel identifier CH_ID identifying a data channel of the feedback data to be converted in a particular slot of a sequence (e.g., identifying a sensor for which data is to be converted during the particular slot) and a conversion start indicator causing conversion of data for a particular slot to begin.

ADC 312 may comprise any suitable system, device, or apparatus configured to receive analog feedback data and convert data streams within such feedback to digitally equivalent signals ADC_DATA based on control signals received from controller 302 which defines slot parameters of the data streams. In some embodiments, ADC 312 may comprise a successive approximation ADC or SAR ADC. When ADC 312 has finished conversion of a data stream slot, ADC 312 may communicate to controller 302 a control signal CONV_DONE indicating that conversion of the data stream slot is complete.

As shown in FIG. 3, ADC subsystem 208 may include a bridge interface 314. Bridge interface 314 may comprise any system, device, or apparatus configured to control delivery of data SAMPLE_DATA from ADC subsystem 208 to processing engine 202. As data is converted by ADC subsystem 208, bridge interface 314 may control delivery of data SAMPLE_DATA to a buffer (e.g., within memory 320) associated with processing engine 202. As data is transferred from ADC subsystem 208 to buffers associated with processing engine 202, bridge interface 314 may append the converted data with metadata regarding the converted data (e.g., stream identifier, phase information, conversion type, etc.). In some embodiments, each stream may have its own dedicated memory buffer. In other embodiments, multiple streams may be combined into a single buffer. A bridge 316 (shown as integral to processing engine 202 in FIG. 3, but which may be integral to ADC subsystem 208 or ADC interface subsystem 210) may communicate a signal SAMPLES_READY to a processing core 318 of processing engine 202, in order to alert processing core 318 to the presence of data that may be processed. In some instances, bridge 316 may provide such alert after a programmable number of buffer writes have occurred, thus setting a decimation rate for the overall system.

As also shown in FIG. 3, ADC interface subsystem 210 may include a programmable control loop timer 310. Control loop timer 310 may be configured to determine an overall control rate for the system. When control loop timer 310 expires, it may communicate a control signal LOOP_TIMER_EXPIRE to core 318 to begin its control processing algorithm for generating control signals to ADC subsystem 208. Control loop timer 310 may also include a programmable phase offset relative to the arrival of data streams. To avoid additional latency in the application of updates to control signals generated by processing engine 202, control loop timer 310 may implement a second timer to generate a control signal CONTROL_LOOP_OFFSET_UPDATE to alert digital output drivers 322 of processing engine 202 of new data to be driven to DAC subsystem 204. This second timer indicated by control signal CONTROL_LOOP_OFFSET_UPDATE may initiate when control loop timer 310 expires and the programmable duration of the second timer may be determined by the time needed for processing algorithms of processing engine 202. In operation, processing engine 202 may split its processing algorithms into critical and non-critical sections, in order to minimize latency of control updates.

Core 318 may, based on sample data stored in memory 320 and timing parameters of control signals LOOP_TIMER_EXPIRE and SAMPLES_READY, generate CONTROL_DATA for controlling digital output drivers 322 to drive digital control signals to DAC subsystem 204.

Using the systems and methods disclosed herein, ADC conversion interface subsystem 210 may enable a processing deadline for processing the plurality of data stream sequences in order to generate control signals for DAC subsystem 204 independent of the sample rate of ADC 312. Thus, the sample rate used for ADC 312 may establish an input sample rate of a plurality of data stream sequences and an output sample rate of digital control signals, and the ADC conversion interface subsystem may be configured to modify the output sample rate for driving control signals to DAC subsystem 204 to optimally align the digital control signals.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a processing engine configured to:
      process feedback data converted from analog feedback data to digital feedback data, wherein the feedback data includes a plurality of data stream sequences converted from the analog feedback data to the digital feedback data at a sample rate, and wherein the sample rate establishes an input sample rate of the plurality of data stream sequences and an output sample rate of digital control signals; and
      based on processing of the feedback data, generate the digital control signals for controlling a system under control; and
   an analog-to-digital conversion interface subsystem communicatively coupled to the processing engine and configured to control the processing of the processing engine and the generation of the digital control signals by the processing engine to reduce latency in the generation of the digital control signals due to processing of the processing engine, wherein the analog-to-digital conversion interface subsystem is further configured to modify the output sample rate from an initial output sample rate to a modified output sample rate, wherein the modified output sample rate is operable to align the digital control signals.

2. The system of claim 1, wherein the analog-to-digital conversion interface subsystem includes a configuration subsystem to:
   determine a number of slots in each of the plurality of data stream sequences; and
   assign individual data channels of the analog feedback data to respective slots.

3. The system of claim 2, wherein the configuration subsystem is further configured to assign at least one individual data channel to a plurality of respective slots.

4. The system of claim 1, wherein a processing deadline for processing the plurality of data stream sequences is independent of the sample rate.

5. The system of claim 1, wherein the system under control is a motor associated with a camera.

6. The system of claim 5, wherein the feedback data is sensor data associated with the motor.

7. A method comprising:
   processing feedback data converted from analog feedback data to digital feedback data, wherein the feedback data includes a plurality of data stream sequences converted from the analog feedback data to the digital feedback data at a sample rate, and wherein the sample rate establishes an input sample rate of the plurality of data stream sequences and an output sample rate of digital control signals;
   based on processing of the feedback data, generating the digital control signals for controlling a system under control;
   controlling the processing of the processing engine and the generation of the digital control signals by the processing engine to reduce latency in the generation of the digital control signals due to processing of the processing engine; and
   modifying the output sample rate from an initial output sample rate to a modified output sample rate, wherein the modified output sample rate is operable to align the digital control signals.

8. The method of claim 7, further comprising:
   determining a number of slots in each of the plurality of data stream sequences; and
   assigning individual data channels of the analog feedback data to respective slots.

9. The method of claim 8, further comprising assigning at least one individual data channel to a plurality of respective slots.

10. The method of claim 7, wherein a processing deadline for processing the plurality of data stream sequences is independent of the sample rate.

11. The method of claim 7, wherein the system under control is a motor associated with a camera.

12. The method of claim 11, wherein the feedback data is sensor data associated with the motor.

13. A computer program product comprising a non-transitory computer usable medium having computer readable code physically embodied therein, said computer program product further comprising computer readable program code for:
   processing feedback data converted from analog feedback data to digital feedback data, wherein the feedback data includes a plurality of data stream sequences converted from the analog feedback data to the digital feedback data at a sample rate, and wherein the sample rate establishes an input sample rate of the plurality of data stream sequences and an output sample rate of digital control signals;
   based on processing of the feedback data, generating the digital control signals for controlling a system under control;
   controlling the processing of the processing engine and the generation of the digital control signals by the processing engine to reduce latency in the generation of the digital control signals due to processing of the processing engine; and
   modifying the output sample rate from an initial output sample rate to a modified output sample rate, wherein the modified output sample rate is operable to align the digital control signals.

14. The computer program product of claim 13, the computer readable program code further for:
   determining a number of slots in each of the plurality of data stream sequences; and
   assigning individual data channels of the analog feedback data to respective slots.

15. The computer program product of claim 14, the computer readable program code further for assigning at least one individual data channel to a plurality of respective slots.

16. The computer program product of claim 13, wherein a processing deadline for processing the plurality of data stream sequences is independent of the sample rate.

17. The computer program product of claim 13, wherein the system under control is a motor associated with a camera.

18. The computer program product of claim 17, wherein the feedback data is sensor data associated with the motor.

* * * * *